US006159853A

United States Patent [19]
Lai

[11] Patent Number: 6,159,853
[45] Date of Patent: Dec. 12, 2000

[54] METHOD FOR USING ULTRASOUND FOR ASSISTING FORMING CONDUCTIVE LAYERS ON SEMICONDUCTOR DEVICES

[75] Inventor: Han-Chung Lai, Tauryuan, Taiwan

[73] Assignee: Industrial Technology Research Institute, Hsin-Chu, Taiwan

[21] Appl. No.: 09/366,738

[22] Filed: Aug. 4, 1999

[51] Int. Cl.$^7$ .................................................. H01L 21/463
[52] U.S. Cl. ......................... 438/676; 438/653; 438/800
[58] Field of Search .................................. 438/653–769, 438/645, 601, 795, 927, 963, 800; 257/751–769, 584; 204/192.15, 192.17, 298.09, 298.15, 298.29; 427/438

[56] References Cited

U.S. PATENT DOCUMENTS

| | | | |
|---|---|---|---|
| 4,985,750 | 1/1991 | Hoshino | 257/751 |
| 5,219,790 | 6/1993 | Miyatake | 438/653 |
| 5,270,252 | 12/1993 | Papanicolaou | 437/176 |
| 5,275,714 | 1/1994 | Bonnet et al. | 205/109 |
| 5,290,733 | 3/1994 | Hayasaka et al. | 437/194 |
| 5,425,965 | 6/1995 | Tamor et al. | 427/249 |
| 5,520,784 | 5/1996 | Ward | 204/192.15 |
| 5,610,103 | 3/1997 | Xu et al. | 438/800 |
| 5,648,128 | 7/1997 | Yeh et al. | 438/788 |
| 5,705,230 | 1/1998 | Matanabe et al. | 427/438 |
| 5,763,018 | 6/1998 | Sato | 427/535 |
| 5,969,422 | 10/1999 | Ting et al. | 257/762 |
| 5,985,747 | 11/1999 | Taguchi | 438/622 |

FOREIGN PATENT DOCUMENTS

99/47731  9/1999  WIPO .

*Primary Examiner*—Matthew Smith
*Assistant Examiner*—Igwe W. Anya
*Attorney, Agent, or Firm*—George O. Saile; Stephen B. Ackerman; William J. Stoffel

[57] ABSTRACT

The present invention provides three embodiments to deposit layers over a substrate using ultrasound energy to vibrate the substrate during (1) PVD or CVD deposition, (2) anneal or (3) plating deposition. The first embodiment deposits a first layer over a substrate using ultrasonic energy to vibrate the substrate. The ultrasound allows the layer to deposit more conformal over opening sidewalls and decreases overhangs and voids. The second embodiment involves using ultrasonic vibrations during annealing or RTA. The ultrasound smooches out barrier/seed/conductive layers in contact holes. The third embodiment is a method of plating a metal layer such as Cu over a substrate while vibrating the substrate with ultrasonic waves. The substrate is vibrated with ultrasound waves in vertical or horizontal direction. The ultrasonic vibration allow the metal to plate in small contact holes with improved step coverage.

27 Claims, 5 Drawing Sheets

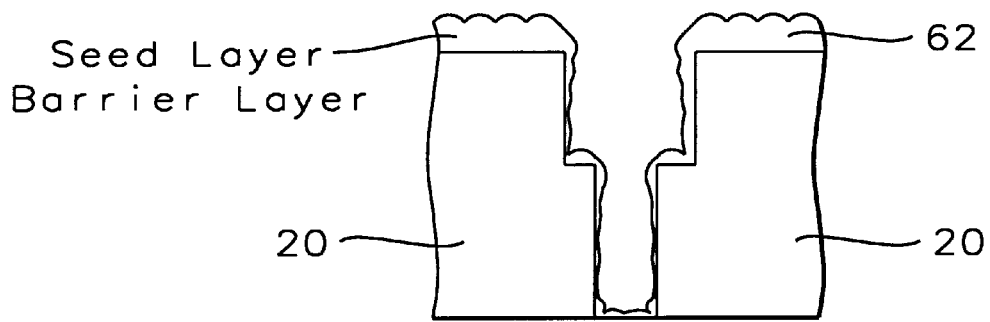
*FIG. 4 - Prior Art*
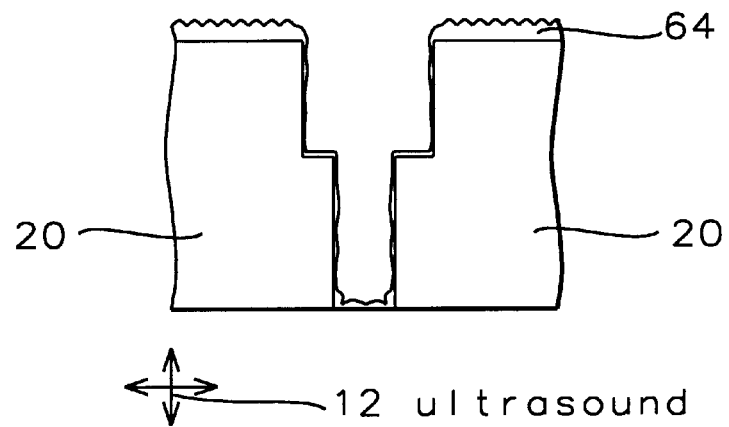
*FIG. 5*
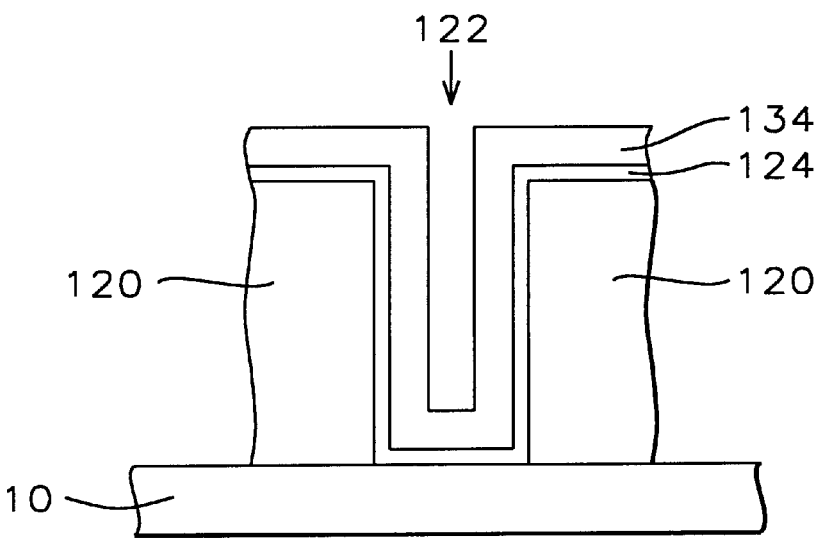
*FIG. 6A*

METHOD FOR USING ULTRASOUND FOR ASSISTING FORMING CONDUCTIVE LAYERS ON SEMICONDUCTOR DEVICES

BACKGROUND OF INVENTION

1) Field of the Invention

This invention relates generally to the fabrication of semiconductor devices using ultrasound and more particularly to a method for electroplating, depositing, or annealing substrates to fill or line contact/via holes while ultrasonically vibrating the substrate.

2) Description of the Prior Art

ULSI circuits are now on the submicron stage of fabrication. Conventional chemical vapor deposition and physical vapor deposition (PVD) processes for depositing metal wiring films suffer from unsatisfactory step coverage with respect to vertical contact hole having a diameter less than 0.5 µm and a high aspect ratio. There is a need for improved deposition and annealing techniques to improve the coverage of films in small diameter and high aspect holes.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,219,790(Miyatake) discloses a process of annealing Al using an ultrasound. U.S. Pat. No. 5,290,733(Hayasaka et al.) discloses a method for plating metal (Al). U.S. Pat. No. 5,425,965(Tasmor et al.) discloses a method for forming polycrystalline diamonds using ultrasound. U.S. Pat. No. 5,275,714(Bonnet et al.) shows an ultrasonic process in a electrolytic deposition. U.S. Pat. No. 5,270,252 (Papanicolaon) shows a photoresist removal wet step using ultrasound.

However, these processes can be further improved.

SUMMARY OF THE INVENTION

It is an object of the present invention to provide a method for applying ultrasonic vibrations to a wafer during the (1) deposition, (2) annealing and/or (3) plating of (a) barrier, (b) seed or (c) conductive layers (e.g., metal plugs) in a contact/via holes.

It is an object of the present invention to provide a method for applying ultrasonic vibrations to a wafer during the (1) deposition, (2) annealing and/or (3) plating of (a) barrier, (b) seed or (c) conductive layers (e.g., metal plugs) in a contact/via holes to improve step coverage.

To accomplish the above objectives, the present invention provides three embodiments to deposit/form layers using ultrasound energy into a contact hole over a substrate to vibrate the substrate during (1) deposition, (2) anneal/RTA or (3) plating deposition. These three embodiments can be used in any combination. The three embodiments are as follows:

(1) $1^{st}$ embodiment—Insitu Ultrasonic vibration during CVD or PVD deposition (2) $2^{nd}$ Embodiment—in-situ or ex-situ ultrasonic Annealing (3) $3^{rd}$ embodiment—ultrasonically plating $1^{st}$ embodiment—Insitu Ultrasonic vibration during CVD or PVD deposition—The first embodiment of the invention deposits a layer over a substrate using ultrasonic energy to vibrate the substrate. This is insitu ultrasonic deposition since the ultrasonic vibrations are applied during deposition. The ultrasound allows the layer to deposit more conformally over opening sidewalls and decreases overhangs and voids.

The first embodiment is a method of depositing a barrier layer, a seed layer or/and a first conductive layer (e.g., plug) over a substrate in a contact hole using ultrasound vibrations and CVD or PVD processes including the following steps. physical vapor deposition (PVD) can comprise evaporation processes, sputtering processes and Molecular Beam Epitaxy (MBE) processes.

A substrate 10 is provided having holes 22 extending through an insulating layer 20 thereon. The substrate 10 is fastened to a plate 11 in a deposition chamber. A first layer is deposited by a chemical vapor deposition (CVD) or a physical vapor deposition (PVD) process on the insulating layer 20 at least partially filling the holes 22 over the substrate. In a key step, during the deposition, Ultrasonic energy 12 is applied to the plate 11 to vibrate the substrate 10. The substrate 10 is vibrated vertically or horizontally or combination thereof. The plate 11 is vibrated at a rate greater than 70 KHz.

$2^{nd}$ Embodiment—in-situ or ex-situ ultrasonic RTP—The second embodiment of the invention involves using ultrasonic vibrations during annealing or RTA of a conductive or barrier layer. The ultrasound smoothes out barrier/seed/conductive layers in or lining contact/via holes. The $2^{nd}$ embodiment is called ex-situ since the ultrasound is applied after the deposition during the anneal. The second embodiment is call in-situ since the wafer can be in-situ anneal in the same cluster tool.

The second embodiment of the invention for annealing a substrate while vibrating said substrate ultrasonically includes the following steps. An insulating layer 120 is formed over substrate 10. The contact hole exposes a portion of a wafer or the contact hole exposes an underlying conductive layer. A barrier layer 124 is deposited preferably composed of Ta or TaN by CVD or Physical Vapor Deposition (PVD).

In the next step we deposit a conductive layer 134 over the barrier layer 124 and at least partially filling the contact hole 122.

In a key step, we heat the substrate 10 and simultaneously vibrate the substrate 10 using ultrasonic waves 112 to flow the conductive layer thereby filling the contact hole.

The substrate is preferably heated to a temperature between 400° C. and 550 (tgt 450° C.) with range +/−10° C.) in a $N_2$ or Ar gas or forming gas ($N_2+H_2$); and vibrating the substrate at a frequency between 1K and 70 kHz. The conductive layer is smoothed by surface diffusion.

Third embodiment—ultrasonically plating—The third embodiment is a method of plating a metal, such as Cu, over a substrate while vibrating the substrate with ultrasonic waves. An insulating layer 220 is formed over a substrate 10. Next, a contact hole 220 is formed extending through the insulator layer 220. Barrier layer 224 preferably composed of TaN/Ta, is formed by Physical Vapor Deposition (PVD) process can be deposited over the insulating layer and lining the contact hole 220. A Seed layer 226 preferably composed of Cu is formed over the barrier layer.

In a key step, a conductive layer 234 preferably comprised of copper is electroplated over the seed layer 226 (e.g., Cu) and barrier layer 224 and vibrating the substrate with ultrasonic waves.

There are 2 options for the position of the wafer in the wafer clamp 250. The clamp can hold the wafer facing upward or downward. The substrate 10 is attached to a wafer clamp 250. Preferably, the exposed surface of the insulator layer 220 or the barrier layer 224 is facing downward.

The substrate can be vibrated with ultrasound waves in vertical or horizontal direction or the plating fluid can be vibrated. The ultrasonic vibrations allow the metal to plate in small contact holes with improved step coverage.

The invention has many advantages over the prior art. The three embodiments of the invention use ultrasonic vibration allow the barrier/metal films to deposit, anneal or plate in small contact holes with improved step coverage.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 4 is a cross sectional view of a simulation of a seed and barrier layer formed by a conventional Deposition technique not using ultrasonic vibrations.

FIG 5 is a cross sectional view of a simulation of a seed and barrier layer formed by a the $1^{st}$ embodiment of the present invention using ultrasonic vibrations during the CVD or PVD process.

FIGS. 6A and 6B are a cross sectional views for illustrating a method for annealing a conductive layer 134 using ultrasonic energy according to the 2nd embodiment of the present invention.

DETAILED DESCRIPTION OF THE PREFERRED EMBODIMENTS

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

$1^{st}$ Embodiment
Ultrasonic Vibrations During Deposition

The first embodiment of the invention deposits a first layer (e.g.,/seed barrier/conductive layer) over a semiconductor structure (e.g., dielectric layer) using ultrasonic energy to vibrate the substrate. The layer preferably can have a three compositions/functions. In contrast to the prior art, the layer is not a dielectric layer. The layer can be a (1) barrier layer, (2) a seed layer and/or (3) a conductive layer that partially of fully fills a hole in an insulating layer. The ultrasonic deposition of the invention can be used to form any one or more combinations of the three layers. The ultrasound allows the layer to deposit more conformal over opening sidewalls and decreases overhangs and voids. The first embodiment is a method of depositing a barrier layer and first layer over a substrate using ultrasound vibrations and CVD or PVD processes including the following steps shown in FIGS. 1 to 3.

Figure 2:
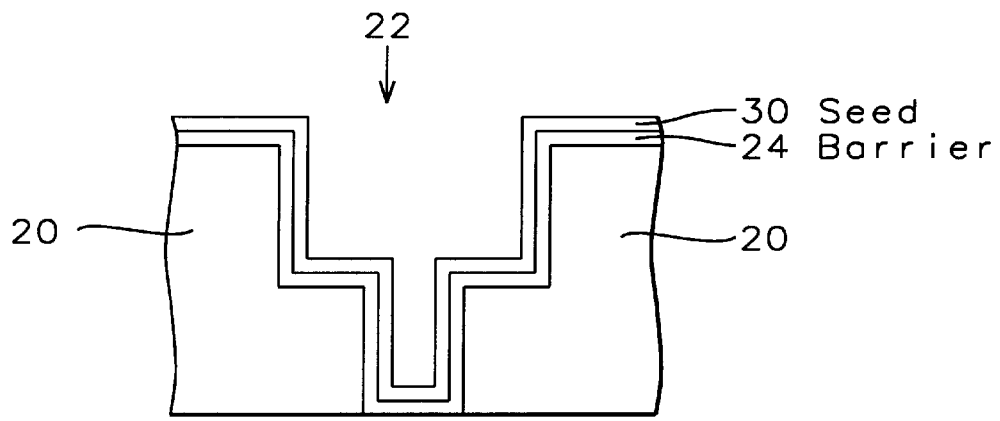
FIGS. 2 and 3 are cross sectional views for illustrating a method for depositing a layer using ultrason energy according to the $1^{st}$ embodiment of the present invention.
Figure 3:
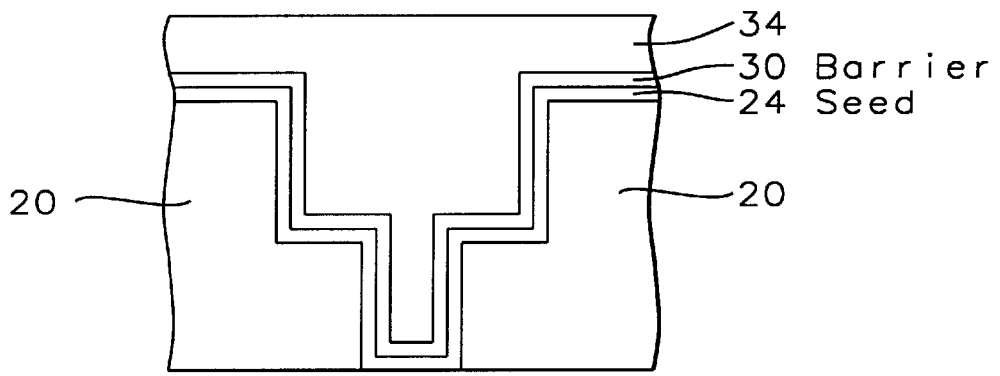

Referring to FIG. 2, a semiconductor structure 10 is provided having holes 22 extending through an insulating layer 20 thereover. The insulating layer can be an interlevel dielectric (ILD) layer (on a substrate) or an inter metal dielectric (IMD) layer (over dielectric and conductive layers, over the substrate). The holes 22 can exposed the silicon surface of a substrate or a conductive line over an insulating layer over the substrate. Semiconductor 10 is understood to possibly include a semiconductor wafer, active and passive devices formed within the wafer and layers formed on the wafer surface. The term "semiconductor structure" is mean to include devices formed within a semiconductor wafer and the layers overlying the wafer.

The substrate 10 is preferably fastened to a plate 11 in a deposition chamber. The deposition chamber can be part of a chemical vapor deposition (CVD) or physical vapor deposition (PVD) reactor.

Figure 1:
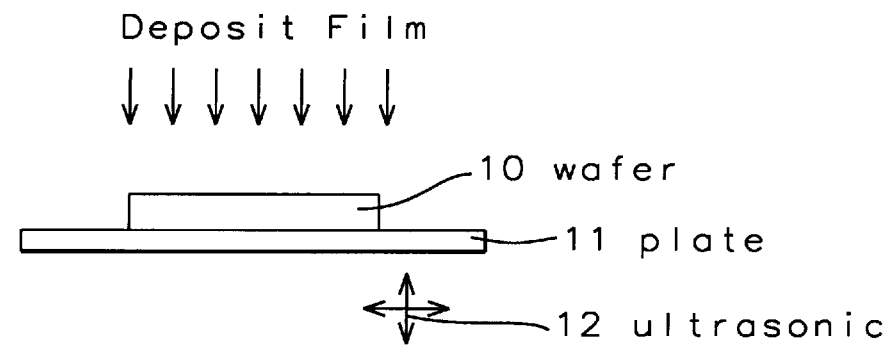
FIG. 1 shows a cross sectional view of a wafer plate 11 through which ultrasonic energy vibrates a wafer during deposition according to the method of the present invention.

As shown in FIG. 1, the substrate 10 is preferably fastened to the plate 11 by an electrostatic chuck or by a vacuum mean. The vacuum mean preferably comprises, such as a vacuum clamp or a clamp. The plate 11 can have vacuum holes.

Using the invention's ultrasonic deposition process, a first layer is then deposited by a chemical vapor deposition (CVD) or a physical vapor deposition (PVD) process on the insulating layer 20 at least partially filling the holes 22 over the substrate. The first layer can be a (a) barrier layer 24, (b) a seed layer 30 or (c) a conductive layer 34.

The PVD processes can be processes selected from the group consisting of Thermal Evaporation, sputtering, Molecular Beam epitaxy, Laser sputtering deposition, ablation deposition, Ion Planting, or Cluster beam deposition.

The CVD processes used can be Low pressure chemical vapor deposition (LPCVD), plasma enhanced chemical vapor deposition (PECVD), Metallorganic Chemical Vapor Deposition (MOCVD), and atmospheric pressure chemical vapor deposition (APCVD) and most preferably PECVD or MOCVD.

A key feature is during the deposition or after deposition, in the same chamber that deposition was performed, Ultrasonic energy 12 is applied to the plate 11 to vibrate the substrate 10. The substrate 10 is vibrated vertically or horizontally or combination thereof. The plate 11 is vibrated at a rate preferably between 1K and 70 KHz or greater than 70 KHz;

and more preferably between 1K and 70 kHz.

(a) Barrier Layer

The first layer can be a barrier layer 24 composed of TiN/Ti, WN or Ta/TaN preferably having a thickness of between about 200 and 1000 Å and the first layer is deposited using a PVD or CVD process at the following conditions; a temperature between 25° C. and 550° C., a pressure between 4 mtorr and 4 torr; and the time, power and gasses depend on the chamber design.

(b) Seed Layer

As shown in FIG. 2, the first layer can be a seed layer 30 composed of Al or Cu; and preferably having a thickness of between about 50 and 2000 Å and the seed layer is preferably deposited using a PVD or CVD process at the following conditions; a temperature between 25° C. and 550° C., a pressure between 4 mtorr and 4 torr; and the time, power and gasses depend on the chamber design.

(c) Conductive Layer

In a third option, the first layer can be a conductive layer 34 comprised of Cu, Cu Alloy, or an Al alloy; and has a thickness of between about 1000 and 20,000 Å.

The first layer composed of Cu is deposited using a PVD or CVD process at the following conditions; a temperature between 25° C. and 550° C., a pressure between 4 mtorr and 4 torr; and the time, power and gasses depend on the chamber design.

Conductive Layer Composed of Al

The first layer can be a conductive layer comprised of Al, and has a thickness of between about 1000 and 20,000 Å and the first layer composed of Cu is deposited using a PVD or CVD process.

The Seed, Barrier and Conductive Layers can be Deposited Using Ultrasound

The first layer can be a multilayer structure comprised of a barrier layer 24 composed of Ti/TiN or Ta/TaN/WN and a seed layer 30 composed of Al or Cu; and a conductive layer 34 composed of Al or Cu; where the barrier layer 24, the seed layer 30 and the conductive layer 34 are deposited while vibrating the substrate using ultrasonic energy 11.

TABLE

Preferred embodiment for barrier layer; Seed layer, and Conductive layer deposited using ultrasound

| Barrier layer | Seed layer | Conductive layer |
| --- | --- | --- |
| Ti/TiN | Al | Al |
| Ta/TaN/WN | Cu | Cu |

Simulation Results—of Layers Formed Using the 1$^{st}$ Embodiment

FIGS. 4A and 4B—Simulation of barrier layers

FIG. 4 is a cross sectional view of a simulation of a seed and barrier layer formed by a conventional Deposition (PVD) techniques not using ultrasonic vibrations. FIG. 5 is a cross sectional view of a simulation of a seed and barrier layer formed by a the 1$^{st}$ embodiment of the present invention using ultrasonic vibrations during the CVD or PVD process. As FIG. 5 shows, the ultrasonic vibrations during the (PVD) deposition of the seed and barrier layer make the layers more conformal and improve step coverage. In FIGS. 4 & 5, the layer 62 and 64 can be either the seed layer or the barrier layer.

The process simulation shows that the layer 62 in FIG. 4 is inferior to the layer in FIG. 5 because the layer 62 in FIG. 4 higher thickness on horizontal surface compared to the thickness on the sidewalls. In contrast the invention's method shown in FIG. 5 shows the thickness of layer 64 on the of the horizontal surface is about the same as the thickness on the sidewalls.

The inventors believe the ultrasound allows more conformal deposition because of the surface and bulk diffusion and the additional kinetic force from the ultra sound.

Example of Preferred Process for 1$^{st}$ Embodiment

Barrier Layer 24

The first layer can be a barrier layer 24 composed of 2 layers of TaN and TiN (TaN/TiN) having a thickness of between about 50 and 1000 Å and the first layer is deposited using a physical vapor deposition (PVD) process at the following conditions; temperature between 25 and 500 ° C; pressure between 1 and 3 torr; ultrasound frequency between 1 KHz and 70 kHz.

Seed Layer 30

As shown in FIG. 2, the seed layer 30 is preferably composed of Cu and has a thickness of between about 500 and 3000 Å and the seed layer is deposited using a PVD process at the following conditions; temp between 25 and 300° C.; Ar gas flow, Ultrasonic frequency between 1 KHz and 70 kHz.

Conductive Layer 34

In a third option, the first layer can be a conductive layer comprised of Cu and has a thickness of between about 1000 and 20,000 Å; and is deposited using a PVD process at the following conditions; temp between 25 and 300° C.; Ar gas flow, Ultrasonic frequency between 1 KHz and 70 kHz.

2$^{nd}$ Embodiment

Ultrasonic RTP/Furnace—in-situ or ex-situ

The second embodiment of the invention involves using ultrasonic vibrations during annealing or rapid thermal anneal (RTA). The ultrasound smoothes out barrier/seed/conductive layers in contact holes.

The second embodiment of the invention for annealing a substrate while vibrating said substrate ultrasonically includes the following steps. As shown in FIG. 6A, an insulating layer 120 is formed over substrate 10. The contact hole exposes a portion of a wafer or the contact hole exposes an underlying conductive layer. A barrier layer 124 is deposited preferably composed of TiN or TaN by CVD or Physical Vapor Deposition (PVD). In an option described above in the first embodiment, the substrate can be vibrated with ultrasound waves during the deposition of the barrier layer. Furthermore the substrate can be vibrated with ultrasound waves in vertical or horizontal direction. Preferably, the substrate is vibrated in the both (X and Y) horizontal directions.

In the next step we deposit a conductive layer 134 over the barrier layer 124 and at least partially filling the contact hole 122. The depositing of the conductive layer further includes simultaneously depositing the conductive layer and vibrating the substrate 10 with ultrasonic waves as described above in the 1$^{st}$ embodiment of the invention.

Figure 6B:
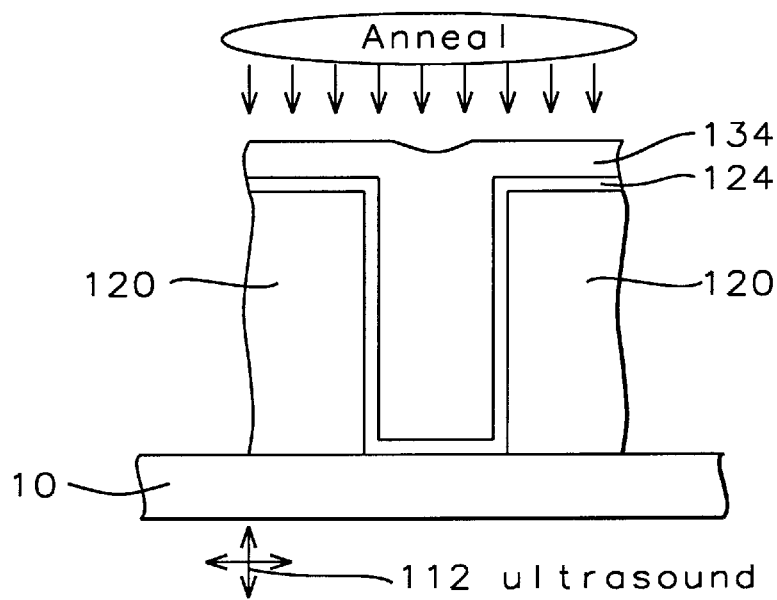

As shown in FIG. 6B, in a key step, we heat the substrate 10 and vibrating the substrate 10 with ultrasonic waves 112 to flow the conductive layer thereby filling the contact hole.

The substrate is preferably heated to a temperature between 400° C. and 800° C. (tgt 500° C.+/−10° C.) in a N$_2$ or Ar gas; and vibrating the substrate at a frequency between 1K and 70 kHz.

Figure 6C:
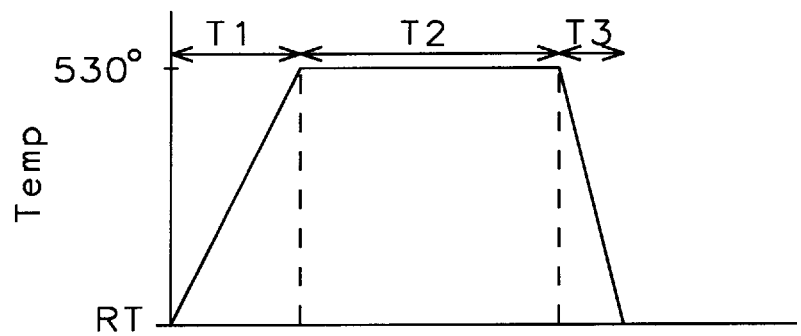
FIG 6C shows a preferred temperature profile for the $2^{nd}$ embodiment on the present invention.

FIG. 6C shows a preferred Temperature profile. During T1, the temperature is ramped up from Room Temp to between 480 and 580° C. from a time between 25 and 35 seconds. During T2, the temp is held constant for between 8 to 12 Minutes. During T3, the temp is ramped down to room temperature. The deposition and substrate vibration using ultrasound preferably occurs only during T2.

Most Preferred Specific Example of the $2^{nd}$ Embodiment of the Invention—Anneal During Ultrasonic Vibrations FIGS. 6A and 6B shows a most preferred example of the $2^{nd}$ embodiment of the invention. As shown in FIG. 6A, an insulating layer 120 is formed over substrate 10. The contact hole exposes a portion of a wafer or the contact hole exposes an underlying conductive layer.

A barrier layer 124 is deposited preferably composed of TiN or TaN by CVD Physical Vapor Deposition (PVD) and has a thickness of between about 200 and 1000 Å.

In the next step we deposit a conductive layer 134 over the barrier layer 124 and at least partially filling the contact hole 122. The depositing of the conductive layer further includes simultaneously depositing the conductive layer and vibrating the substrate 10 with ultrasonic waves. The conductive layer is preferably Cu formed by a PVD sputter process. The copper layer preferably has a thickness of between about 1000 and 3000 Å.

As shown in FIG. 6B, in a key step, we heat the substrate 10 and vibrating the substrate 10 with ultrasonic waves 112 to flow the conductive layer thereby filling the contact hole.

The anneal is at a temperature between about 450 and 550° C. for a time between about 10 to 30 minutes and the ultrasound vibrations are between 1 KHZ and 70 KHz The substrate is preferably heated to a temperature between 25 and 400° C. in a $N_2$ or Ar gas; or $H_2$ or forming gas ($N_2$ and $H_2$) and vibrating the substrate at a frequency between 1 k and 70 kHz.

The most preferred second embodiment process can be summarized as shown in the table below.

TABLE most preferred second embodiment process - Anneal with ultrasound

| Step | | Most preferred parameter |
|---|---|---|
| 1 - FIG. 6A | Depositing a barrier layer 124 composed of Ta or TaN | |
| 2 | depositing a conductive fill layer 134 at least partially filling the hole 122 | **option - combine deposition with ultrasonic vibration - (combine $1^{st}$ and $2^{nd}$ embodiments of the invention.) |
| 3 - FIG. 6B | annealing and vibrating using ultrasonic energy to reflow the conductive layer | Time - between 10 min and 30 minutes Temperature = 450 and 550° C. Vibration rate and parameters 1k to 70 kHz ultrasound waves in both vertical and/or horizontal directions; |

Third Embodiment—
Ultrasonically Plating

Figure 9:
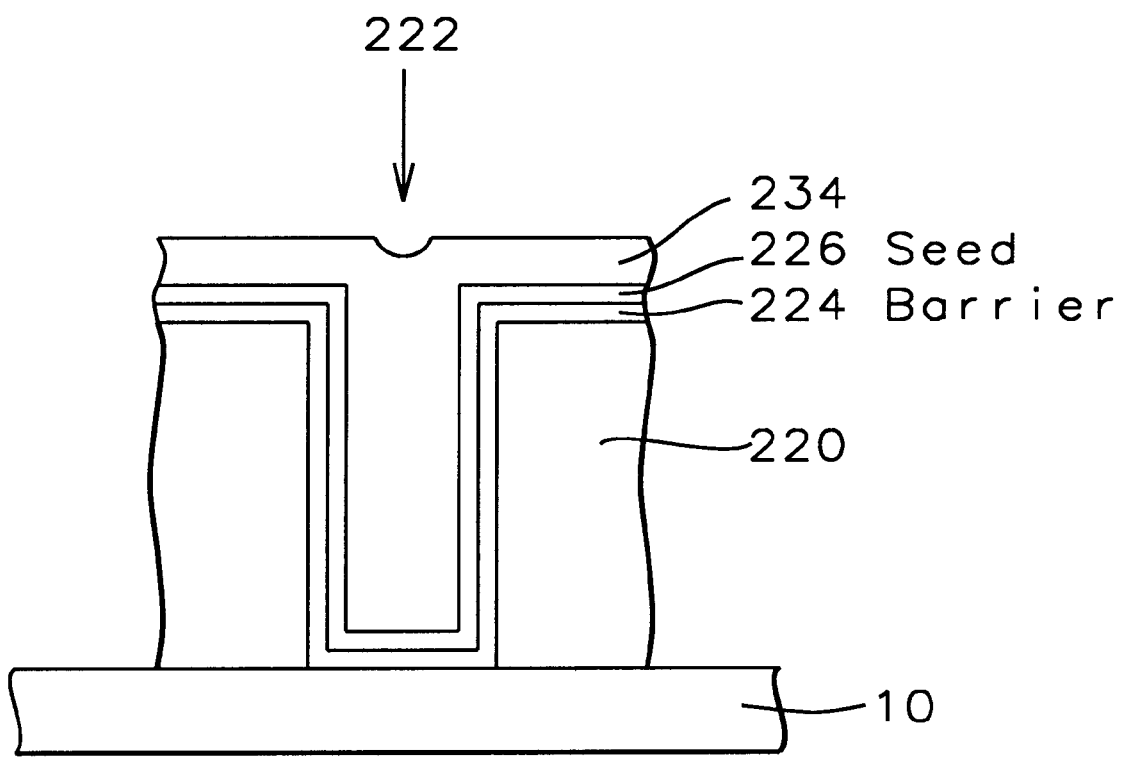
FIG. 9 is a cross sectional view of a wafer being plated using ultrasound according to the $3^{rd}$ embodiment of the present invention.

The third embodiment is a method of plating a Cu over a substrate while vibrating the substrate with ultrasonic waves. Referring to FIG. 9, an insulating layer 220 is formed over a semiconductor structure 10. Next, a contact hole 220 is formed extending through the insulator layer 220. A Barrier layer 224 preferably composed of TaN/Ta, preferably formed by Physical Vapor Deposition (PVD) process can be deposited over the insulating layer and lining the contact hole 220.

Next a seed layer 226 is formed over the barrier layer 224. The seed layer is preferably composed of Cu.

In a key step, a conductive layer 234 preferably comprised of copper is electroplated over the seed layer 226 and vibrating the substrate with ultrasonic waves.

Figure 7A:
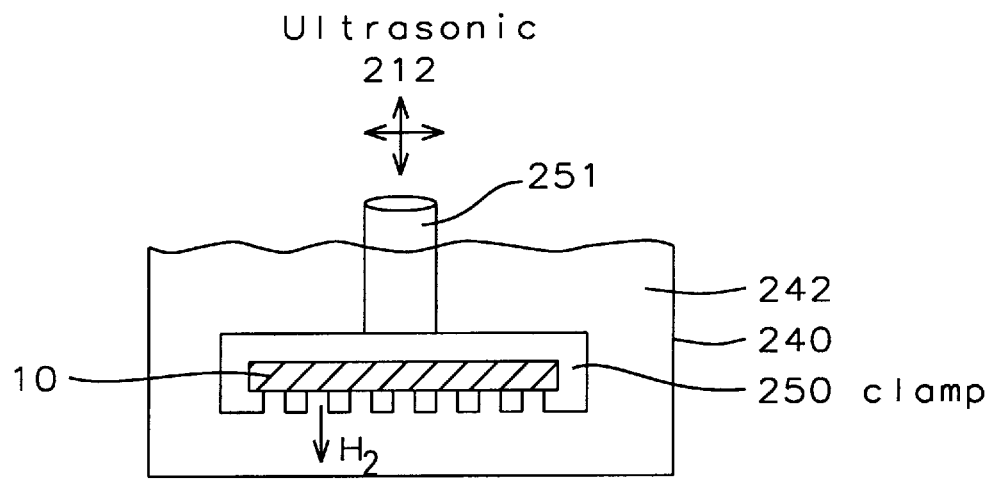
FIG. 7A is a cross sectional view of a plating apparatus used to plate metal onto a wafer using ultrasonic energy according to the $3^{rd}$ embodiment of the invention where the wafer is facing downward.

In this key electroplate step, there are 2 options for the position of the wafer in the wafer clamp 250. The clamp can hold the wafer facing upward or downward (preferred). The substrate 10 is attached to a wafer clamp 250. Preferably, the exposed surface of the insulator layer 220 or the barrier layer 224 is facing downward. FIG. 7A is a cross sectional view of a plating apparatus (tank 240) is used to plate metal onto a wafer 10 using ultrasonic energy according to the $3^{rd}$ embodiment where the wafer 10 is facing downward. The plating solution 242 plate metal onto the wafer. The clamp 250 holds the wafer and a vibrating means 251 can vibrate the wafer with ultrasonic energy 212. Alternately, the plating fluid can be vibrated.

Figure 7B:
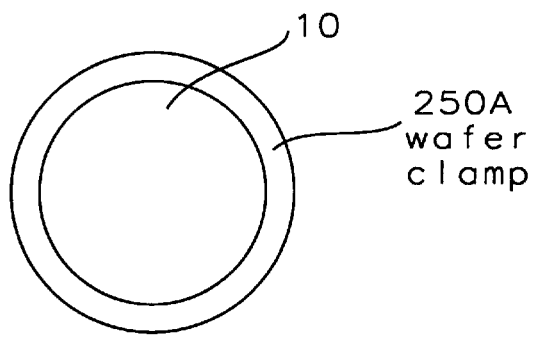
FIG. 7B is a top plan view of a wafer clamp and wafer used in the plating apparatus according to the $3^{rd}$ embodiment of the present invention.

FIG. 7B is a top plan view of a wafer clamp and wafer 10 used in the plating apparatus according to the $3^{rd}$ embodiment of the present invention showing the top rim 250A of the wafer clamp.

Figure 7C:
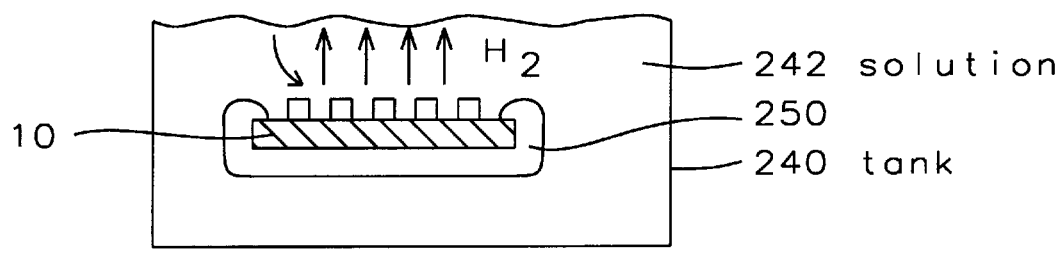
FIG. 7C is a cross sectional view of a plating apparatus used to plate metal onto a wafer using ultrasonic energy according to the $3^{rd}$ embodiment of the invention where the wafer is facing upwards.

FIG. 7C is a cross sectional view of a plating apparatus used to plate metal onto a wafer 10 using ultrasonic energy according to the $3^{rd}$ embodiment of the invention where the wafer is facing upwards.

Figure 8:
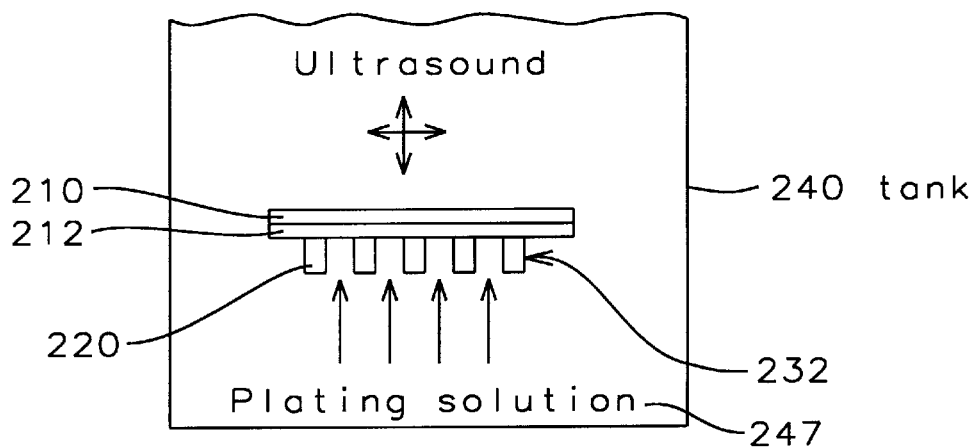
FIG. 8 is a cross sectional view of a wafer being plated using ultrasound according to the $3^{rd}$ embodiment of the present invention.

FIG. 8 shows the wafer 210 facing down in a plating tank 240. The plating solution 242 plates metal over the hole 222 and insulating layer 220 and underlying layer 212 (e.g., metal line or Silicon substrate surface). The ultrasonic vibrations can be applied to the wafer through a vibration means shown in FIGS. 7A 7B & 7C or by vibrating the solution 242 by a ultrasonic device attached to the tank.

The semiconductor structure (substrate) is vibrated with ultrasound waves in vertical or horizontal direction. The ultrasonic vibration allows the metal to plate in small contact holes with improved step coverage. The ultrasound allows the solution to more easily diffuse into and out from the tight holes on the seed layer. The plating process can be an electrochemical deposition (ECD), electrolesss plating or electroplating process.

Alternately, the tank can have an ultrasonic source that can vibrate the plating solution.

Example of Most Preferred Process for the Third Embodiment

Referring to FIG. 9, an insulating layer 220 is formed over a substrate 10. Next, a contact hole 220 is formed extending through the insulator layer 220. A Barrier layer 224 preferably composed of TaN/Ta, formed by sputtering process can be deposited over the insulating layer and lining the contact hole 220.

A seed layer preferably composed of Cu is next formed.

In a key step, a conductive layer 234 preferably comprised of copper is electroplated over the seed layer 226 while vibrating the substrate with ultrasonic waves.

The most preferred process for the third embodiment process can be summarized as shown in the table below.

TABLE most preferred $3^{rd}$ embodiment process - plating with ultrasound

| Step | Most preferred parameters |
|---|---|
| 1 - FIG. 9 | depositing a barrier layer 224 composed of Ta or TaN |

TABLE-continued most preferred 3rd embodiment process - plating with ultrasound

| Step | | Most preferred parameters |
|---|---|---|
| 2 | Deposit seed layer 226 over barrier layer | Cu seed layer |
| 3 - FIG. 9 | plating a conductive fill layer 234 composed of Cu while vibrating the substrate or plating fluid using ultrasound at least partially filling the hole 222 | |

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method of depositing a first layer, using ultrasonic vibrations, over contact hole in an insulating layer comprising:
   (a) providing a semiconductor structure having holes extending through an insulating layer thereon;
   (b) fastening said semiconductor structure to a plate in a deposition chamber;
   (c) depositing by a CVD or PVD process and simultaneously applying ultrasonic energy to said plate to vibrate said semiconductor structure; to form a first layer on said insulating layer at least partially filling said holes over said semiconductor structure; said first layer is not comprised of Aluminum that is sputter deposited.

2. The method of claim 1 wherein said first layer is a barrier layer composed of Ta/TaN having a thickness of between about 500 and 1000 Å and said first layer is deposited using a physical vapor deposition (PVD) sputter process at a temperature between 25° C. and 550° C., a pressure between 4 mtorr and 4 torr and at a ultra sound frequency between 1 kHZ and 70 kHz.

3. The method of claim 1 wherein said first layer is a seed layer composed of Cu and having a thickness of between about 500 and 1000 Å and said first layer is deposited using a PVD process at the following conditions; at a temperature between 25° C. and 550° C., a pressure between 4 mtorr and 4 torr; and at a ultra sound frequency between 1 k and 70 kHz.

4. The method of claim 1 wherein said first layer is a conductive layer comprised of Cu; and has a thickness of between about 2000 and 7000 Å.

5. The method of claim 1 wherein said first layer is a conductive layer comprised of Cu, and has a thickness of between about 2000 and 7000 Å and said first layer composed of Cu is deposited using a PVD process of sputtering at the following conditions; at a temperature between 25° C. and 550° C., a pressure between 4 mtorr and 4 torr; and at a ultra sound frequency between 1 k and 70 kHz.

6. The method of claim 1 wherein said first layer is a conductive layer comprised of Al, and said first layer is deposited using a PVD process.

7. The method of claim 1 wherein said first layer is a multilayer structure comprised of a barrier layer composed of Ti/TiN and a seed layer composed of Al and a conductive layer composed of Al; where said barrier layer, said seed layer and said conductive layer are deposited while vibrating said substrate using ultrasonic energy.

8. The method of claim 1 wherein said PVD process is a process selected from the group consisting of Thermal Evaporation, Molecular Beam epitaxy, Laser sputtering deposition, ablation deposition, Ion Planting, and Cluster beam deposition.

9. The method of claim 1 wherein said CVD process is a process selected from the group consisting of Low pressure chemical vapor deposition (LPCVD), plasma enhanced chemical vapor deposition (PECVD), Metallorganic Chemical Vapor Deposition (MOCVD), and atmospheric pressure chemical vapor deposition (APCVD).

10. The method of claim 1 wherein said substrate is fastened to said plate by a electrostiatic chuck or by a physical means.

11. The method of claim 1 wherein said substrate is vibrated verically or horizontally or combination thereof; and said plate is vibrated at a rate greater than 70 KHz.

12. A method of annealing a substrate while vibrating said substrate ultrasonically comprising:
   (a) forming an insulating layer over a substrate;
   (b) forming a contact hole extending through said insulating layer;
   (c) depositing a barrier layer composed of Ti/TiN or Ta/TaN by CVD or Physical Vapor Deposition (PVD) while vibrating said substrate with ultrasound waves in vertical or horizontal directions;
   (d) depositing a conductive layer comprised of copper over said barrier layer and at least partially filling said contact hole; and
   (e) heating said substrate and vibrating said substrate with ultrasonic waves to flow said conductive layer thereby filling said contact hole.

13. The method of claim 12 wherein said insulating layer is an interlevel dielectric or inter metal dielectric layer and wherein said contact hole exposes a portion of a wafer or said contact hole exposes an underlying conductive layer.

14. The method of claim 12 the depositing of said conductive layer further includes simultaneously depositing said conductive layer and vibrating said substrate with ultrasonic waves.

15. The method of claim 12 said substrate is heated to a temperature between 450 and 550° C. in a $N_2$ or Ar gas; and vibrating said substrate at a frequency between 1 k and 70 kHz.

16. A method of plating a Cu layer over a substrate while vibrating said substrate with ultrasonic waves comprising:
   forming an insulating layer over a substrate;
   forming a contact hole extending through said insulator layer;
   depositing a barrier layer composed of TaN/Ta by Physical Vapor Deposition (PVD) over said insulating layer and lining said contact hole; depositing a seed layer composed of Cu over said barrier layer;
   electroplating a copper layer over said barrier layer and simultaneously vibrating said substrate with ultrasonic waves.

17. The method of claim 18, wherein the eletroplating step further includes attaching said substrate to a wafer clamp so that the exposed surface of said insulator layer is facing downward; and vibrating said substrate with ultrasound waves in vertical or horizontal direction.

18. The method of claim 16 wherein which further includes attaching said substrate to a wafer clamp so that the exposed surface of said insulator layer is facing upward; and vibrating said substrate with ultrasound waves in vertical or horizontal direction.

19. The method of claim 16 wherein said barrier layer has a thickness of between about 200 and 1000 Å.

20. A method of plating a Cu layer over a substrate while vibrating said substrate with ultrasonic waves comprising:

forming an insulating layer over a substrate;

forming a contact hole extending through said insulator layer;

forming a barrier layer composed of TaN/Ta by Physical Vapor Deposition (PVD) over said insulating layer and lining said contact hole; said substrate is vibrating during said physical vapor deposition (PVD);

depositing a seed layer composed of Cu using a PVD process over said barrier layer; said substrate is vibrating during said physical vapor deposition (PVD) of said seed layer; and electroplating a copper layer over said barrier layer while vibrating said substrate with ultrasonic waves.

21. A method of depositing a first layer, using ultrasonic vibrations, over a contact hole in an insulating layer comprising:

(a) providing a semiconductor structure having holes extending through an insulating layer thereon;

(b) placing said semiconductor structure in a deposition chamber; and (c) depositing by a CVD process and simultaneously applying ultrasonic energy to vibrate said semiconductor structure; to form a first layer on said insulating layer at least partially filling said holes over said semiconductor structure.

22. The method of claim 21 wherein said first layer is a barrier layer composed of Ta/TaN having a thickness of between about 500 and 1000 Å and said first layer is deposited using a CVD at a temperature between 25° C. and 550° C., a pressure between 4 mtorr and 4 torr; and at an ultra sound frequency between 1 kHz and 70 kHz.

23. The method of claim 21 wherein said first layer is a seed layer composed of Cu and having a thickness of between about 500 and 1000 Å and said first layer is deposited using a CVD process at the following conditions; at a temperature between 25° C. and 550° C., a pressure between 4 mtorr and 4 torr; and at an ultra sound frequency between 1 kHz and 70 kHz.

24. The method of claim 21 wherein said first layer is a conductive layer comprised of Cu, Al or an Al alloy; and has a thickness of between about 2000 and 7000 Å.

25. The method of claim 21 wherein said first layer is a multilayer structure comprised of a barrier layer composed of Ti/TiN and a seed layer composed of Al and a conductive layer composed of Al; where said barrier layer, said seed layer and said conductive layer are deposited while vibrating said substrate using ultrasonic energy.

26. A method of plating a Cu layer over a substrate while vibrating said substrate with ultrasonic wavers comprising:

forming an insulating layer over a substrate;

forming a contact hole extending through said insulator layer;

forming a barrier layer over said insulating layer and lining said contact hole;

depositing a seed layer composed of Cu over said barrier layer; and electroplating a cooper layer over said barrier layer while vibrating said substrate with ultrasonic waves; said substrate is attached to a wafer clamp so that the exposed surface of said insulator layer is facing downward; and vibating said substrate with ultrasound waves in vertical or horizontal direction.

27. The method of claim 26 which further includes after forming the barrier layer and before depositing the seed layer, depositing a seed layer composed of Cu using a physical vapor deposition (PVD) process over said barrier layer; said substrate is vibrating by ultrasonic means during said physical vapor deposition (PVD) of said seed layer.

* * * * *